(12) United States Patent
Parsons

(10) Patent No.: US 6,884,635 B2
(45) Date of Patent: Apr. 26, 2005

(54) CONTROL OF POWER DELIVERED TO A MULTIPLE SEGMENT INJECT ELECTRODE

(75) Inventor: Richard Parsons, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 298 days.

(21) Appl. No.: 10/244,417

(22) Filed: Sep. 17, 2002

(65) Prior Publication Data

US 2003/0052085 A1 Mar. 20, 2003

Related U.S. Application Data

(63) Continuation of application No. PCT/US01/09199, filed on Mar. 23, 2001.
(60) Provisional application No. 60/192,508, filed on Mar. 28, 2000.

(51) Int. Cl.$^7$ .......................... H01L 21/00; H00H 1/00; C23C 16/00
(52) U.S. Cl. ...................... 438/10; 438/710; 427/569; 156/345.28; 156/345.43; 156/345.47; 156/345.48; 118/723 E; 118/723 I
(58) Field of Search ..................... 156/345.28, 345.24, 156/345.43, 345.47, 345.48; 118/723 E, 723 I; 438/10, 710, 712; 427/569, 533–535

(56) References Cited

U.S. PATENT DOCUMENTS

| | | | | |
|---|---|---|---|---|
| 5,057,185 A | * | 10/1991 | Thomas et al. | .............. 438/710 |
| 5,116,482 A | * | 5/1992 | Setoyama et al. | ..... 204/298.08 |
| 5,140,223 A | | 8/1992 | Gesche et al. | |
| 5,273,610 A | * | 12/1993 | Thomas et al. | ........ 156/345.28 |
| 5,556,549 A | * | 9/1996 | Patrick et al. | ................. 216/61 |
| 5,565,074 A | | 10/1996 | Qian et al. | |
| 5,733,511 A | | 3/1998 | De Francesco | |
| 5,889,252 A | | 3/1999 | Williams et al. | |
| 5,907,221 A | * | 5/1999 | Sato et al. | .............. 315/111.51 |
| 5,981,899 A | * | 11/1999 | Perrin et al. | ........... 219/121.52 |
| 6,229,264 B1 | * | 5/2001 | Ni et al. | ................. 315/111.51 |

FOREIGN PATENT DOCUMENTS

WO   WO 97/02589   1/1997

* cited by examiner

*Primary Examiner*—Parviz Hassanzadeh
(74) *Attorney, Agent, or Firm*—Pillsbury Winthrop LLP

(57) ABSTRACT

An RF power supply system (200) for use with an electrode (60) in a plasma reactor system (10) capable of supporting a plasma (32) with a plasma load impedance ($Z_R$), wherein the electrode comprises a plurality of electrode segments (62a, 62b, . . . , 62n). The system comprises a master oscillator (210), and a plurality of RF power supply subsystems (220a, 220b, . . . 220n) each electronically connected thereto, and to respective ones of the electrode segments. Each RF power supply subsystem includes a phase shifter (224), an amplifier/power supply (230), a circulator (236), a directional coupler (242), and a match network (MN/L). The latter has a match network impedance. The system further includes a control system (184) electronically connected to each RF power supply subsystem. The control system dynamically changes the match network impedance for each subsystem to match the plasma load impedance, and also adjusts one or more of the phase shifters in response to an electrode segment receiving power from other electrode segments. A method of controlling the RF power supply system is disclosed, as is a method for processing a substrate (40) with a plasma processing system having the RF power supply system of the present invention.

17 Claims, 9 Drawing Sheets

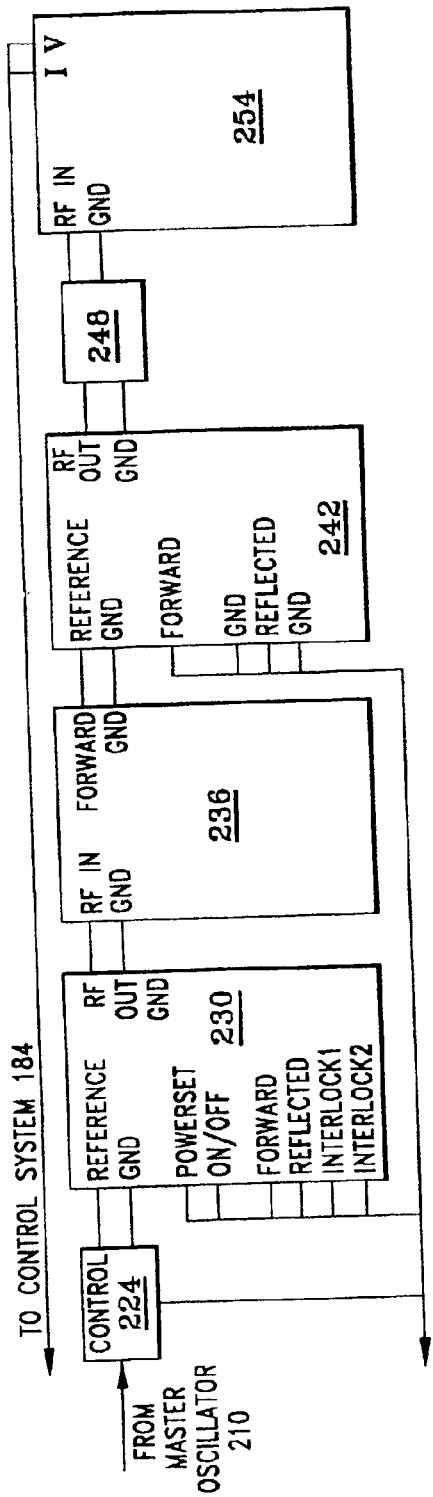
FIG. 4A
FIG. 4B
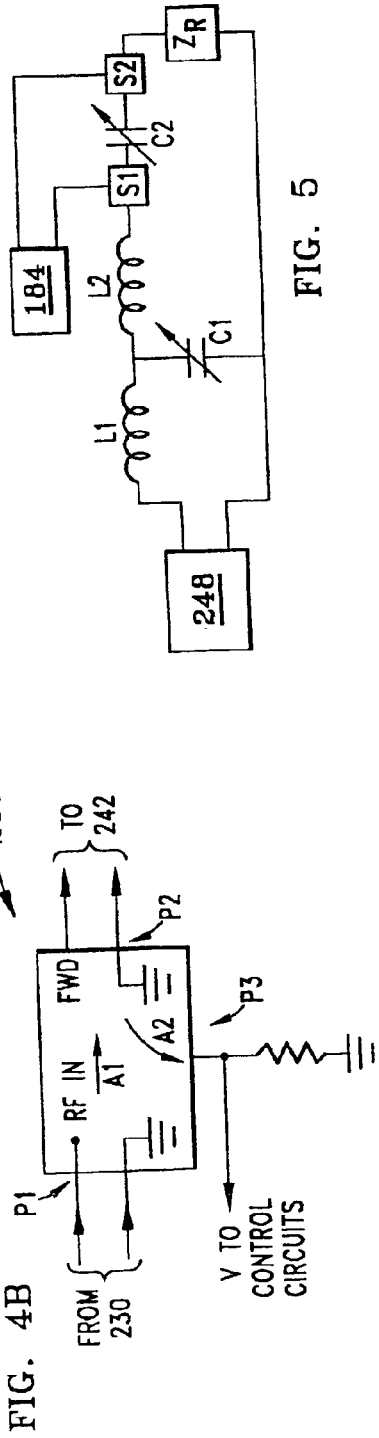
FIG. 5

CONTROL OF POWER DELIVERED TO A MULTIPLE SEGMENT INJECT ELECTRODE

This a Continuation of International Application No. PCT/US01/09199, which was filed on Mar. 23, 2001, which, in turn, claims benefit of U.S. Provisional Application No. 60/192,508, which was filed Mar. 28, 2000.

FIELD OF THE INVENTION

The present invention relates to plasma reactor systems, and in particular to an RF power supply system for same that delivers radio frequency (RF) power to a segmented electrode in a controlled manner.

BACKGROUND OF THE INVENTION

Ionized gas or "plasma" may be used during processing and fabrication of semiconductor devices, flat panel displays and other products requiring etching or deposition of materials. Plasma may be used to etch or remove material from semiconductor integrated circuit wafers, sputter or deposit material onto a semiconducting, conducting or insulating surface. Creating a plasma for use in manufacturing or fabrication processes typically is done by introducing a low-pressure process gas into a chamber surrounding a work piece such as an integrated circuit (IC) wafer. The molecules of the low-pressure gas in the chamber are ionized into a plasma by the radio frequency energy (power) source after entering the chamber, and the plasma flows over the work piece. The chamber is used to maintain the low pressures required for the plasma and to serve as a structure for attachment of one or more radio frequency energy sources.

Plasma may be created from a low-pressure process gas by inducing an electron flow that ionizes individual gas molecules by transferring of kinetic energy through individual electron-gas molecule collisions. Typically, electrons are accelerated in an electric field such as one produced by radio frequency (RF) energy. This RF energy may be low frequency (below 550 KHz), high frequency (13.56 MHz), or microwave frequency (2.45 GHz).

The two main types of etching in semiconductor processing are processing includes plasma etching or reactive ion etching (RIE). A plasma etching system includes a radio frequency energy source and a pair of electrodes. A plasma is generated between the electrodes, and the work piece (i.e., substrate or wafer) to be processed is arranged parallel with one of the electrodes. The chemical species in the plasma are determined by the source gas (es) used and the desired process to be carried out.

A problem that has plagued prior art plasma reactor systems is the control of the plasma to obtain uniform etching and deposition. In plasma reactors, the degree of etch or deposition uniformity is determined by the design of the overall system, and in particular the power control of the electrodes used to create the plasma in the interior of the reactor chamber.

In a plasma reactor system, at least one electrode is connected to an RF power supply. The technological trend in plasma reactor design is to increase the fundamental RF driving frequency of the RF power supply from the traditional value of 13.56 MHz to 60 MHz or higher. Doing so improves process performance, but increases the complexity of reactor design. A second trend in reactor design is to have multiple or multi-segmented electrodes. However, segmented electrodes combined with increased operating frequencies makes the delivery of the correct amount of RF power more complicated because of capacitive coupling and greater sensitivity to parasitic capacitive and inductive elements. This effect is exacerbated by the shorter wavelengths of higher fundamental frequencies. The result is increased difficulty in improving process uniformity.

Power delivered to a multiple segment electrode presents a unique power control problem. Each segment of the electrode acts as both a transmitter element and a receiver element. If each segment is powered at the same RF frequency, differentiation of received power, or reflected power, and transmitted, or forward, power, becomes difficult. This is because conventional phase and magnitude detectors cannot differentiate between power emanating from the power supply and power transmitted through the plasma from another power supply and received by the electrode.

Compensating for reflections in an RF power deliver system for a plasma reactor having a segmented electrode also requires accurate impedance measurements. These impedance measurements are needed to adjust the parameters of the matching network. However, forward and reverse propagating energy render conventional measurements difficult to interpret.

There are several U.S. patents related to plasma processing systems and apparatus and control of power thereto. For example, U.S. Pat. No. 5,556,549, entitled "Power control and delivery in plasma processing equipment," describes an invention that monitors the power, voltage, current, phase, impedance, harmonic content and direct current bias of the radio frequency energy being delivered to a plasma chamber. In addition, the plasma mode of operation may be controlled by creating either a capacitively or inductively biased radio frequency source impedance. A radio frequency circulator prevents reflected power from the plasma chamber electrode from damaging the power source and it further dissipates the reflected power in a termination resistor. The termination resistor connected to the circulator also effectively terminates harmonic energy caused by the plasma non-linearities. Multiple plasma chamber electrodes and radio frequency power sources may be similarly controlled. However, a shortcoming of this invention is that it concentrates on a single electrode implementation and does not address the complex issue of power control and delivery to multiple electrodes. The invention also does not teach one skilled in the art how to differentiate between power reflected back to an RF power source due to load impedance mismatch and power received from an adjacent electrode. Rather, the invention describes the use of conventional phase and magnitude detectors for power control. Such detectors may not function correctly in multiple electrode/multiple match network configurations.

U.S. Pat. No. 5,889,252, entitled "Method of and apparatus for independently controlling electric parameters of an impedance matching network," describes an arrangement and method for matching a load and a power source, such as an RF power source for a vacuum plasma processing chamber, and includes a match network coupled between the power source and the load. The match network has at least two controllably variable electrical characteristics. A sensor is provided that senses at least two parameters of the load. A drive controller responds to the sensed parameters of the load to independently control variation of a first one of the electrical characteristics of the match network as a function of only one of the parameters of the load, and a second one of the electrical characteristics of the match network as a function of another one of the parameters of the load. This is done until the power source and the load are in a matched condition. The separation of the match variables to establish a nearly one-to-one correspondence with the load parameters allows independent adjustment of the match variables to provide fast and unambiguous reaching of the matched condition. However, a shortcoming of this invention is that it does not account for a configuration having multiple electrodes (i.e., electrode segments) and the associated multiple RF power supplies and match networks. Accordingly, the invention does not teach how to independently control independently driven electrodes.

U.S. Pat. No. 5,733,511, entitled "Power distribution for multiple electrode plasma systems using quarter wavelength transmission lines," describes a multiple electrode plasma reactor power splitter and delivery system to provide balanced power to a plurality of powered electrodes by utilizing the properties of quarter wave length transmission lines. Each electrode is supplied power by a separate $(2N+1)\lambda/4$ wavelength cable, where N=0, 1, 2. . . , connected to a common point at a load matching network's output. The impedance transformation properties of these lines are also employed to convert the plasma load to one that is more efficiently matched . Also disclosed is a technique of splitting a single large active electrode into smaller active electrodes powered by the above distribution scheme in order to achieve maximum uniformity of the reactive plasma throughout the working volume. However, a shortcoming of this invention is that it does not teach how to independently control a plurality of RF power supplies to independently drive a corresponding plurality of electrode segments.

U.S. Pat. No. 5,140,223, entitled "Circuit for adjusting the impedance of a plasma section to a high-frequency generator," describes a circuit for adjusting the impedance of a plasma section to a high-frequency generator wherein three capacitors are connected in series between the high-frequency generator and an electrode of the plasma section; located between the generator and the electrode are two parallel oscillatory circuits. However, a shortcoming of this invention is it does not teach how to independently control a plurality of RF power supplies to independently drive a corresponding plurality of electrode segments.

BRIEF SUMMARY OF THE INVENTION

The present invention relates to plasma reactor systems, and in particular to an RF power supply system for same that delivers RF power to a segmented electrode in a controlled manner.

The present invention provides a method and apparatus for controlling RF power delivered to each electrode segment in a segmented electrode and for differentiating between forward propagating and reverse propagating RF power. The present invention also allows for conventional current and voltage measurements in the power supply system associated with a multiple segment inject electrode.

A first aspect of the invention is an RF power supply system for use with an electrode in a plasma reactor system capable of supporting a plasma with a plasma load impedance ($Z_R$), wherein the electrode comprises a plurality of electrode segments. The system comprises a master oscillator, and a plurality of RF power supply subsystems each electronically connected thereto, and to respective ones of the electrode segments. Each RF power supply subsystem includes a phase shifter, an amplifier/power supply, a circulator, a directional coupler, and a match network. The latter has a match network impedance. The system further includes a control system electronically connected to each RF power supply subsystem. The control system dynamically changes the match network impedance for each subsystem to match the plasma load impedance, thus optimizing the amount of power transferred to the plasma. The control system also adjusts one or more of the phase shifters in response to an electrode segment receiving power from other electrode segments. This accounts for the coupling between the electrode segments, which affects the state of the plasma and hence the quality of the etch process.

A second aspect of the invention is a plasma reactor system, capable of supporting a plasma in an interior region of a plasma chamber, for processing a substrate. The plasma reactor system comprises a substrate support member arranged in the interior region, and an electrode having a plurality of electrode segments arranged in the interior region adjacent the substrate support member. The plasma is formed between the substrate support member and the electrode. The system further includes the RF power supply system as described above, which is electronically connected to the master oscillator and respective ones of the electrode segments. The system also includes a gas supply system in pneumatic communication with the interior region.

A third aspect of the invention is a method of controlling RF power delivered to a plurality of electrode segments in the processing of a substrate with a plasma. The plasma has a plasma load impedance. Further, each electrode segment is connected to a match network having a capacitance and a match network impedance. The method comprises a first step of, providing RF power having a phase to a first of the electrode segments. The next step is monitoring the power delivered to the plasma and the power reflected from the plasma. The next step is adjusting the match network capacitance to achieve maximum transfer of RF power to the plasma through the first electrode segment. The next step is monitoring the power received by the first electrode segment from one or more of the electrode segments. The final step is adjusting the phase of the RF power so as to reduce the power received by the first electrode segment from the one or more electrode segments.

A fourth aspect of the invention is a computer-readable medium containing instructions for carrying out the method of the present invention.

BRIEF DESCRIPTION OF THE SEVERAL VIEWS OF THE DRAWING

FIG. 4A is a block diagram showing further details of the elements making up each RF power supply sub-system shown in FIG. 3;

FIG. 4B is a schematic diagram showing the three ports of the circulator of the multiple segment inject RF power supply sub-system shown in FIG. 4A;

FIG. 5 is a schematic circuit diagram of the match network and load of the RF power supply sub-system of FIG. 3, showing the current and voltage sensors;

DETAILED DESCRIPTION OF THE INVENTION

The present invention relates to plasma reactor systems, and in particular to an RF power supply system for same that delivers RF power to a segmented electrode in a controlled manner.

The present invention is an apparatus and method that allows for control of multiple electrode segments of a segmented electrode as used in a plasma reactor system. The present invention uses sensors to detect and minimize reverse propagating power.

Figure 1:
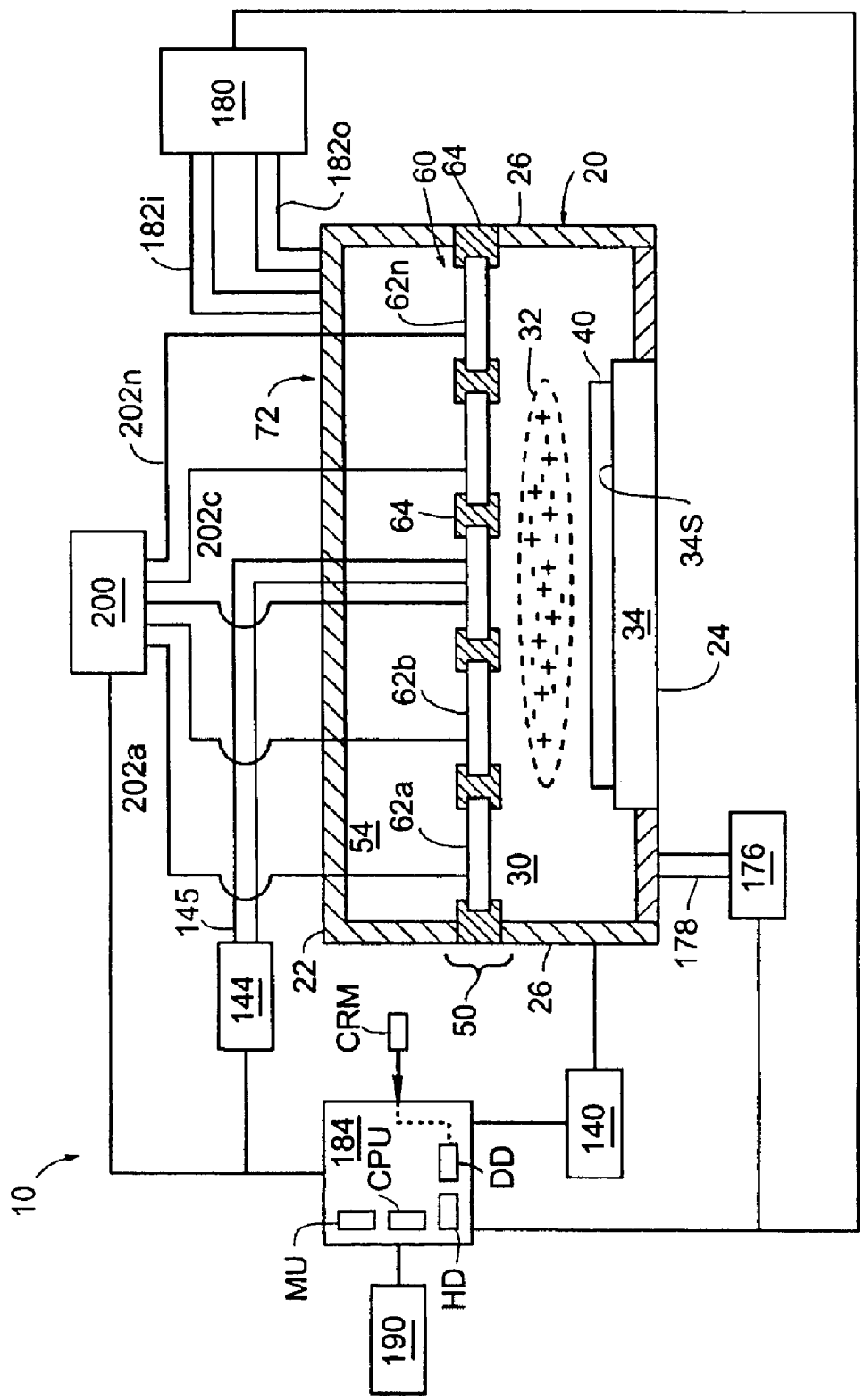
FIG. 1 is a cross-sectional schematic diagram of the plasma reactor system according to the present invention, which includes an exemplary segmented electrode and RF power supply control system connected thereto.

With reference to FIG. 1, plasma reactor system 10 of the present invention comprises a plasma chamber 20 with an upper wall 22, a lower wall 24, side walls 26 and an interior region 30 capable of containing a plasma 32. System 10 further includes within interior 30 of chamber 20 adjacent lower wall 24 a substrate support member 34 with a support surface 34S for supporting a substrate 40, such as a silicon wafer. Substrate 40 also serves as a lower electrode. System 10 also includes, within chamber 20 adjacent upper wall 22, an electrode assembly 50, which defines an upper chamber region 54 capable of containing a cooling fluid for cooling the electrode assembly. The latter includes a segmented electrode 60 comprising two or more electrode segments $62a$, $62b$, ... $62n$. separated by an insulating region, or regions, 64. Insulator region 64 comprises an insulating material such as ceramic, and isolates the electrode segments from each other and from wall 26. Electrode segments $62a$, $62b$, ... $62n$ are preferably planar or substantially so, and are preferably arranged parallel with support surface 34S.

Figure 2A:
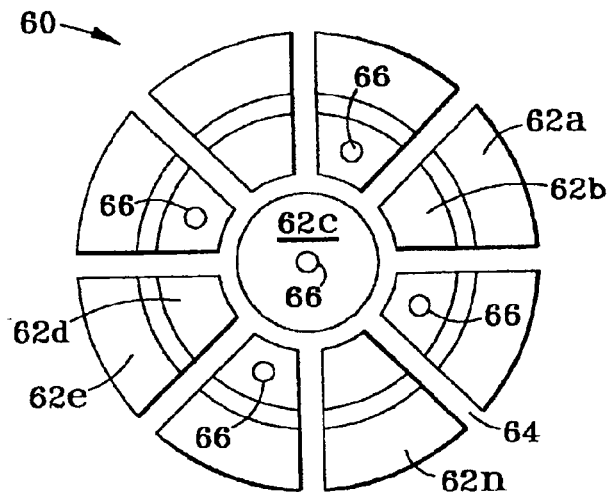
FIG. 2A is a plan view of an exemplary segmented electrode having 17 electrode segments.
Figure 2B:
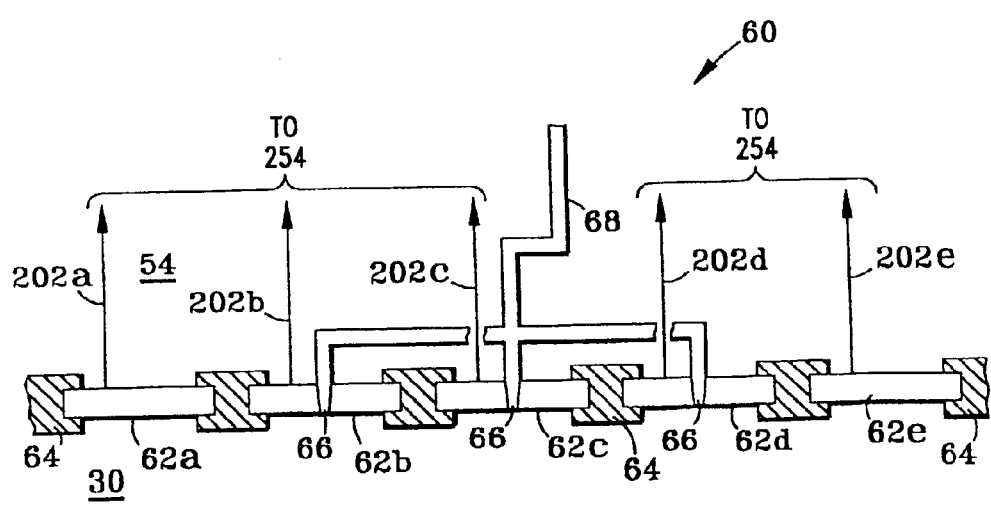
FIG. 2B is a cross-sectional schematic diagram close-up view of the segmented electrode shown in FIG. 2A, showing in more detail the gas supply conduits, gas supply lines, and RF power feed lines connected to the electrode segments.

With reference to FIGS. 2A and 2B, an exemplary segmented electrode has electrode segments $62a$, $62b$, ... $62n$ that are concentrically arranged. Electrode segments $62a$, $62b$, ... $62n$ may be stationary or may be connected to displacement actuators and be movable. An adjustable electrode assembly and plasma reactor system having such an assembly is disclosed in Provisional U.S. patent application Ser. No. 60/175,284, the disclosure of which Patent Application is incorporated herein by reference. As the present invention applies generally to a multi-segment electrode, any one of a number of multi-segment electrode assemblies may be used. The particular multi-segment electrodes mentioned herein are exemplary and for the sake of discussion.

With continuing reference to FIGS. 2A and 2B, one or more of electrode segments $62a$, $62b$, ... $62n$ preferably include a gas conduit 66 connected to a gas supply line 68, which allows gas to flow in to interior 30 from a gas supply system outside chamber 20. Electrode segments $62a$, $62b$, ... $62n$ are connected to respective RF power supply sub-systems via RF feed lines $202a$, $202b$, ... $202n$, as discussed in greater detail below.

With reference again to FIG. 1, system 10 further includes a wafer handling system and robotics system 140 in operative communication with plasma chamber 20, for placing and removing substrates (i.e., wafers) 40 onto and from substrate support member 34. Also included is a gas supply system 144 in pneumatic communication with chamber 20 via a gas supply line 68 connected to gas conduits 66, for supplying gas to chamber interior 30 to purge the chamber and to create plasma 32. The particular gases included in gas supply system 144 depend on the application. However, for plasma etching applications, gas supply system 144 preferably includes such gases as chlorine, hydrogen-bromide, octafluorocyclobutane, and various other fluorocarbon compounds, etc., and for chemical vapor deposition applications, preferably includes silane, ammonia, tungsten-tetrachloride, titanium-tetrachloride, and the like.

Further included in system 10 is a vacuum system 176 in pneumatic communication with chamber 20 via a vacuum line 178. Also preferably included is a cooling system 180 in fluid communication with electrode chamber 72 through chamber upper wall 22 via an input fluid line $182i$ and an output fluid line $182o$, for circulating a cooling fluid into and out of upper chamber region 54.

System 10 also includes a main control system 184, which is in electronic communication with, and controls and coordinates the operation of, gas supply system 144, vacuum system 176, wafer handling system 140, cooling system 180, and RF power supply system 200 (described below) through electronic signals. Main control system 184 thus controls the plasma processing of substrates 40 in system 10, also as described below. In a preferred embodiment, main control system 184 is a computer having a memory unit MU having both random-access memory (RAM) and read-only memory (ROM), a central processing unit CPU (e.g., PENTIUM™ processor from Intel Corporation), and a hard disk HD, all electronically connected. Hard disk HD serves as a secondary computer-readable storage medium, and may be, for example, a hard disk drive for storing information corresponding to instructions for control system 184 to carry out the present invention, as described below. Control system 184 also preferably includes a disk drive DD, electronically connected to hard disk HD, memory unit MU and central processing unit CPU, wherein the disk drive is capable of accepting and reading (and even writing to) a computer-readable medium CRM, such as a floppy disk or compact disk (CD), on which is stored information corresponding to instructions for control system 184 to carry out the present invention. It is also preferable that control system 184 have data acquisition and control capability. A control system 184 is a computer, such as a DELL PRECISION WORKSTATION 610™, available from Dell Corporation, Dallas, Tex.

System 10 also includes a database 190 electronically connected to (or alternatively, integral to) control system 184 for storing data pertaining to the plasma processing of substrate 40, and for also including predetermined sets of instructions (e.g., computer software) for operating system 10 via control system 184.

Figure 3:
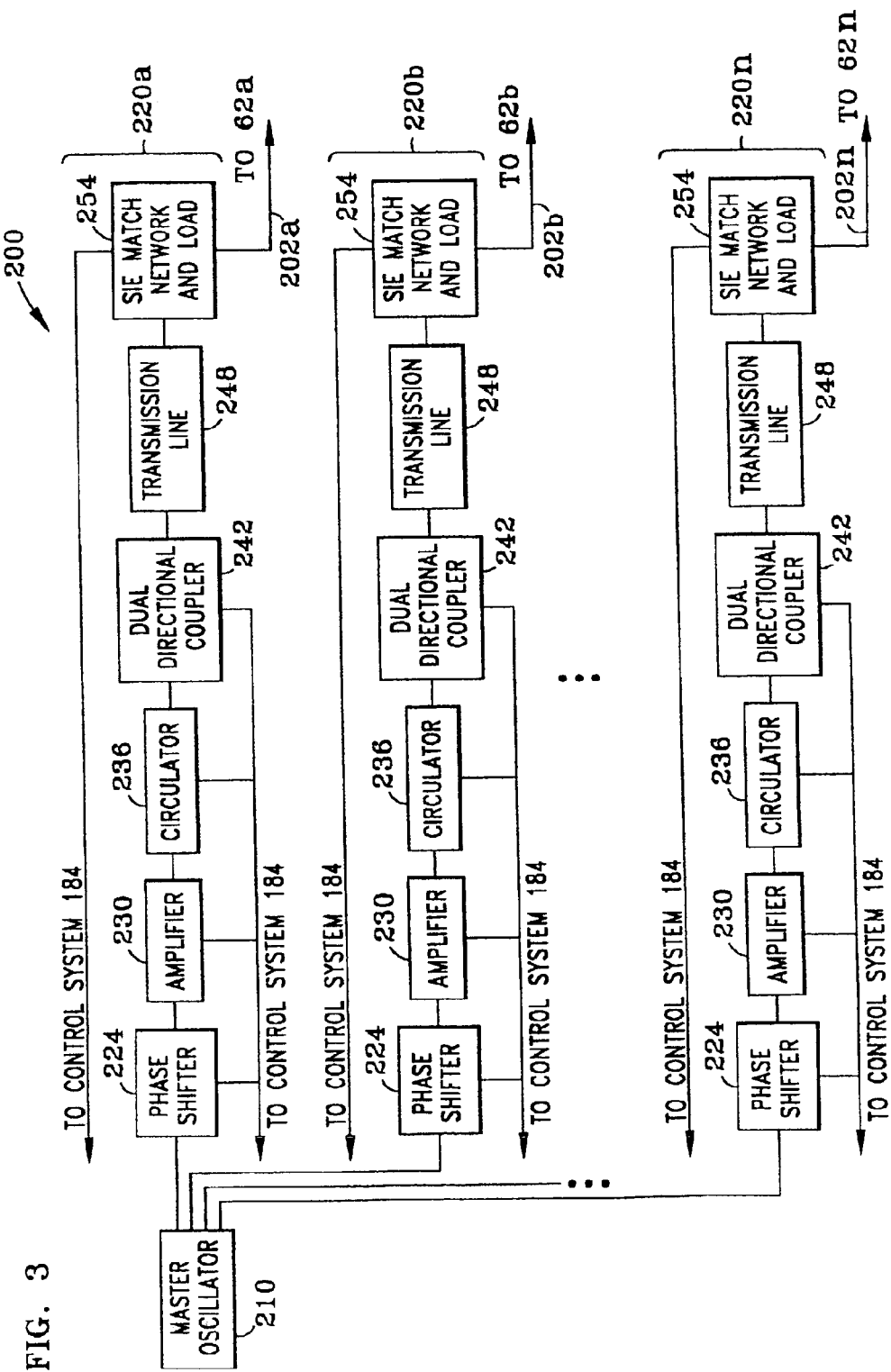
FIG. 3 is a detailed schematic block diagram of the elements making up each RF power supply sub-system of the RF power supply system of FIG. 1.

System 10 also includes aforementioned multiple segment inject electrode RF power supply system 200 electronically connected to control unit 184 and to electrode assembly 50 via RF feed lines $202a$, $202b$, ... $202n$. With reference now to FIGS. 3 and 4, multi-segment inject electrode RF power system 200 comprises a master oscillator 210 which feeds n separately controlled RF power supply sub-systems 220a, 220b, . . . 220n which deliver power to each of n electrode segments 62a, 62b, . . . 62n via RF feed lines 202a, 202b, . . . 202n, respectively. Each sub-system 220a, 220b, . . . 220n comprises a phase shifter (i.e., phase shift network) 224 electronically connected to master oscillator 210, an amplifier/power supply 230 electronically connected to phase shifter 224, a circulator 236 electronically connected to amplifier/power supply 230, a dual directional coupler 242 electronically connected to circulator 236, a transmission line 248 electronically connected to dual directional coupler 242, and a segmented inject electrode (SIE) match network and load (hereinafter, "MN/L") 254 electronically connected to transmission line 248 and to electrode segments 62a, 62b, . . . 62n via RF feed lines 201a, 202b, . . . 202n, respectively. Of the elements 224 through 254, all but transmission line 248 are electronically connected to control system 184. As described below, sensors in MN/L 254 detect the current and voltage within each sub-system and send electronic signals representative of the current and voltage to control system 184.

Circulator 236 protects amplifier/power supply 230 from damage and allows for differentiation between power delivered to the plasma by amplifier/power supply 230 and power received by the electrode segments. In an ideal adjustment of MN/L 254, there is no power from the fundamental or harmonic frequencies dissipated by the load connected to third port P3 of circulator 236. Unlike the prior art, the present invention does not dissipate the power associated with higher harmonic frequencies in a dummy load. Rather, the present inventors have discovered that higher harmonics can be more efficient at generating plasma, and can be a signature of high plasma density, and accordingly have devised in the present invention a way of reflecting power at such frequencies back into the plasma rather than dissipating it.

With reference now to FIG. 5, match network and load 254 comprises electronic circuitry that matches the output impedance of RF amplifier/power supply 230 (which is typically at 50Ω) to the load impedance of the plasma and electrode segments (which are typically in the range of 1–10Ω). FIG. 5 is a circuit diagram of MN/L 254, the circuit comprising fixed inductors L1 and L2, and tunable capacitors C1 and C2. These elements make up the match network, which is tuned in the manner described below to provide the best load match to the plasma impedance as represented by $Z_R$. Inductors L1, L2, and capacitor C1 are configured in a T, with capacitor C1 going to ground. A first sensor S1 located between L2 and C2 senses the current I flowing therebetween, and a second sensor S2 located between capacitor C2 and $Z_R$ senses the voltage V across load $Z_R$. Sensor S1 may be, for example, a current meter, and sensor S2 may be, for example, a voltage probe. Sensors S1 and S2 are electronically connected to control system 184 and send information representative of current I and voltage V to control system 184 via respective electrical signals.

With reference again to FIGS. 3 and 4A, master oscillator 210 drives the n phase shifters (i.e., phase shift networks) 224, which are the front end of sub-systems 220a, 220b, . . . 220n that deliver RF power to each electrode segment 62a, 62b, . . . 62n. The preferred operating frequency of master oscillator 210 is 60 MHz, but the present invention may be operated in the frequency range from 13.56 MHz to 180 MHz. The output of each phase shifter 224 is fed into amplifier/power supply 230. The latter is separated from the particular electrode segment by RF circulator 236. With reference now to FIG. 4B, each circulator 236 is preferably a ferro-magnetic device having three ports P1–P3, designed to receive energy from an associated phase shifter 224 via port P1 and to pass energy to the electrode segments and to the plasma via port P2 (as indicated by arrow A1), and to protect the amplifier/power supplies from possible damage due to large standing wave ratios. This protection is accomplished by diverting reflected energy (as indicated by arrow A2) into measurement circuits and dummy loads via port P3, such as a 50 ohm resistor R1.

With continuing reference to FIGS. 3 and 4A, dual directional coupler 242 measures forward propagating power and reflected (i.e., reverse) propagating power at a given point in a circuit. Dual directional coupler 242 thus provides control system 184 with data on forward power delivered to the particular electrode segment 62a, 62b, . . . 62n, as well as reverse power reflected from the particular electrode segment match network 254 and power received by the particular electrode segment from neighboring electrode segments. Dual directional coupler 242 is connected to MN/L 254 via transmission line 248, which is designed to be an integer multiple in length of a half wavelength of the fundamental RF frequency, making the line transparent at the fundamental frequency. Each sub-system 220a, 220b, . . . 220n also provides for monitoring of the voltage at a feed point of each electrode segment via sensor SI and also provides for monitoring of the current via sensor S1 in series with the output inductor L2, as described above in connection with FIG. 5.

Dual directional coupler 242 can be constituted by a standard device that can sample the forward and reflected RF power in a RF circuit. In general, dual directional coupler 242 has a high power RF input and RF output, and two additional RF outputs, one for the forward power and one for the reflected power. The forward and reflected powers are RF signals which may each be converted, via a diode detector, to a DC signal that is directly proportional to the respective forward or reflected powers. In the system described herein, coupler 242 is a standard dual directional coupler modified to include these detectors necessary to convert attenuated RF signals output from the dual directional coupler to respective DC signals that are then sent to the control computer. Thus, the detector outputs from coupler 242 are analog voltages that represent the forward and reflected powers. One example of a commercially available dual directional coupler is available from Amplifier Research, as Model # DC2500 (10 kHz–220 MHz, 50 db, 2500 W) and one example of a suitable power detector that may be incorporated into that coupler is available from Amplifier Research, as Model # PH2000 Power Head.

The reflection coefficient Γ is the ratio of reflected to incident voltage at the point of reflection.

$$\Gamma = \frac{V_r}{V_i} = \frac{Z_R - Z_O}{Z_R - Z_O} \qquad (1)$$

where $V_r$ is the reflected voltage, $V_i$ is the incident voltage, $Z_R$ is the load impedance and $Z_O$ is the characteristic impedance of the source.

The reflection coefficient Γ may also be expressed in terms of incident and reflected power:

$$\frac{P_r}{P_i} = 1 - |\Gamma|^2 \quad (2)$$

wherein $P_r$ is reflected power and $P_i$ is incident power. These relationships are used below to determine proper operating parameters (e.g., the values of C1 and C2) for the ML/Ns and the phase shift networks.

Method of Operation

Figure 6A:
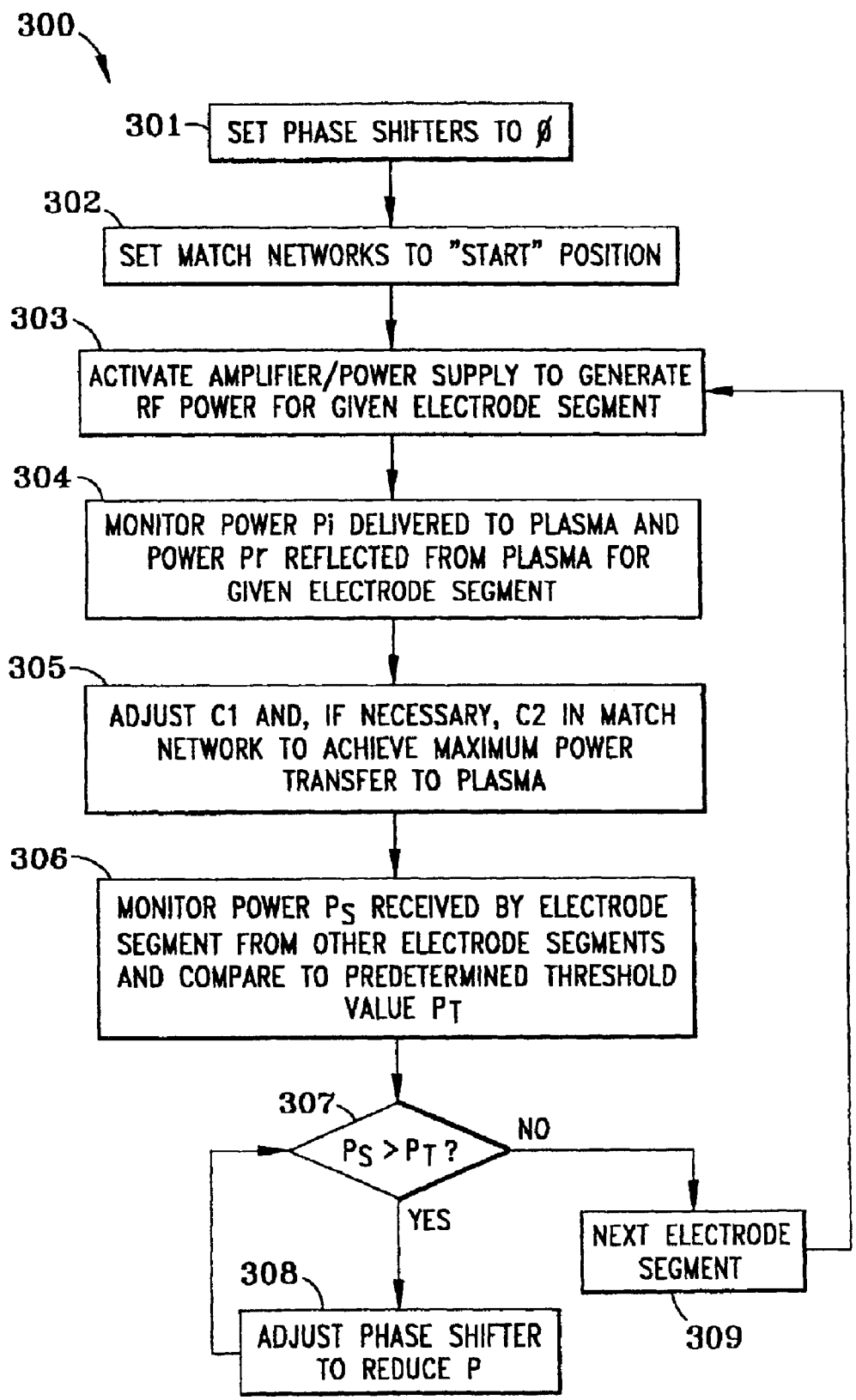
FIG. 6A is a flow diagram of the method steps of operating the RF power supply sub-systems of the present invention.

With reference now to FIG. 6A and flow diagram 300, the method for obtaining the optimum match network settings using the present invention includes the following steps. In the first step 301, control system 184 sends an electrical signal to each phase shift networks 224 and sets the phase to zero. In the second step 302, MN/Ls 254 are set by control system 184 to a predetermined 'start' position, i.e., the match networks are set to a value that permits adequate transfer of power to each electrode segment 62a, 62b... 62n, to initiate the formation of plasma 32. This is necessary because plasma 32 initially has an impedance greater than 100 ohms, but this value drops significantly (e.g., down to 1 ohm or so) once plasma 32 is formed and is stabilized. For example, C2 can be adjusted to its mid-range value, and C1 can be adjusted to 200 pF, for all electrode segments.

In the third step 303, control system 184 activates amplifier/power supply 230 to generate RF power to a given electrode segment. This power may be reduced from the full power required for the particular process step, but sufficient to ignite plasma (e.g., 20% of full power).

In the fourth step 304, the power passing through directional coupler 242 is monitored and an electrical signal representative thereof sent to control system 184. In addition, the amount of power reflected from plasma 32 and passing back through directional coupler 242 is monitored and an electrical signal representative thereof sent to control system 184.

Figure 6B:
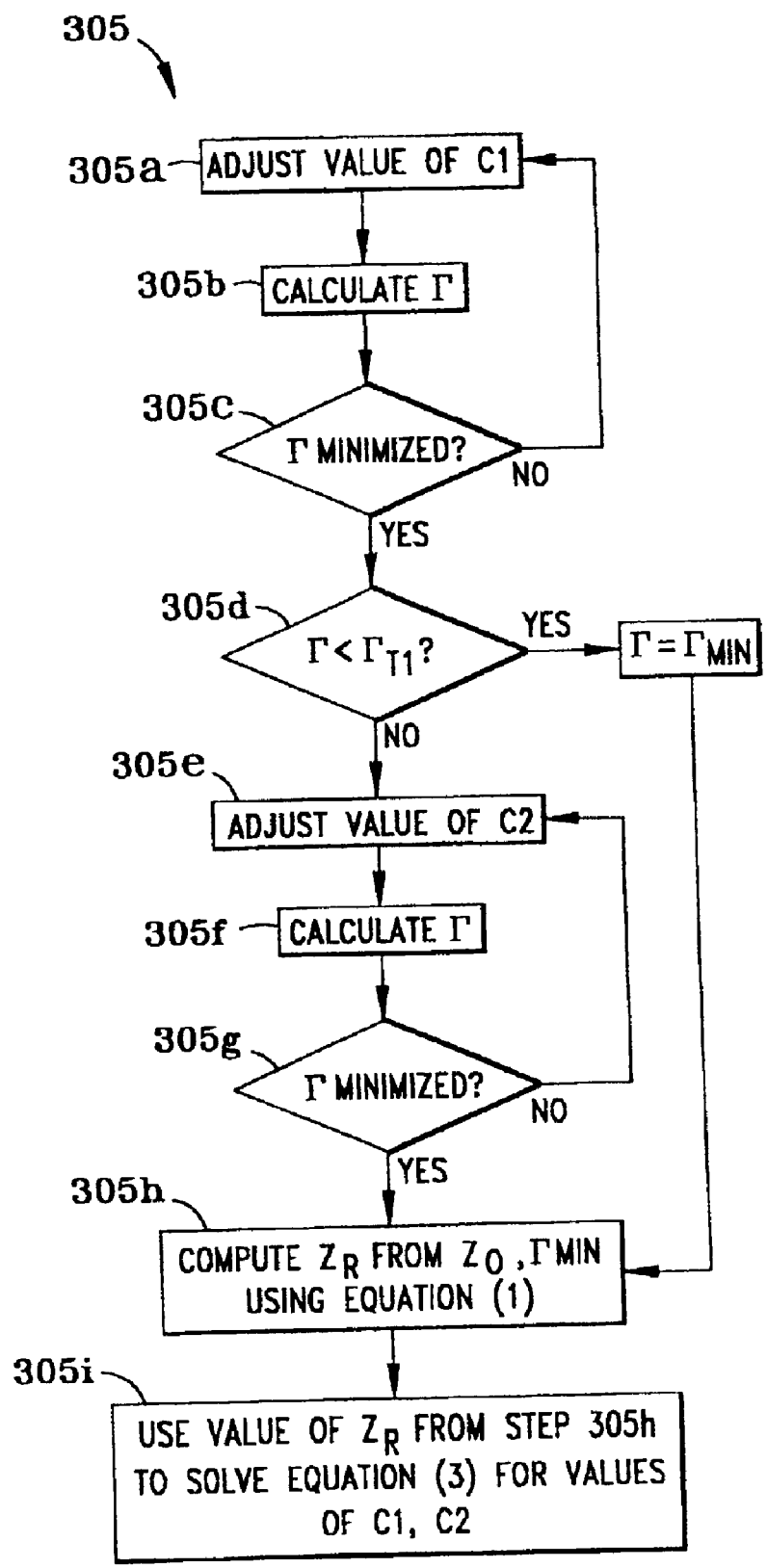
FIG. 6B is a flow diagram showing the steps for determining the capacitance values for the capacitors in the match network that match the impedance of the match network to the measured impedance of the plasma.

In the fifth step 305, the values of capacitors C1 and C2 are adjusted for a maximum forward power indication from directional coupler 242. With reference now also to FIG. 6B, in step 305a, the value of C1 is first adjusted. In step 305b, the reflection coefficient $\Gamma$ is calculated using equation (2) based on the values of $P_i$ and $P_r$ measured by directional coupler 242. In step 305c, the question is asked whether $\Gamma$ is minimized. If not, the process iterates between steps 305a and 305c until the value for C1 that minimizes $\Gamma$ is obtained. If the answer is "yes," then in the next step 305d, the question is asked whether $\Gamma$ is less than a first threshold value $\Gamma_{T1}$ (i.e., $\Gamma < \Gamma_{T1}$), wherein $\Gamma_{T1}$ is preferably 0 or a small fraction, such as 0.1. If the answer is yes, then the value of C2 does not need to be adjusted, and MN/L 254 is at its optimum adjustment. The process then continues to step 305h.

However, if $\Gamma > \Gamma_{T1}$, then not enough power from amplifier/power supply 230 is being coupled to the plasma. Accordingly, in a manner similar to the steps discussed above for adjusting C1, in step 305e, the value of C2 is adjusted to further minimize $\Gamma$. In step 305f, the reflection coefficient $\Gamma$ is measured, and in step 305g, the question is asked whether $\Gamma$ is minimized. If the answer to this query is "no," then the process iterates between steps 305e and 305g until a minimum for $\Gamma$ ($\Gamma_{MIN}$) is obtained. If the answer is "yes," then MN/L 254 is at its optimum adjustment, and the process proceeds to step 305h. In step 305h, the plasma load $Z_R$ is computed from equation (1) using the values for $Z_0$ and $\Gamma_{MIN}$.

With continuing reference to FIG. 6B, in steps 305a and 305e, the values of C1 and C2 were adjusted to obtain the minimum reflection coefficient and thus the most flow of power to the plasma. This resulted in a calculated value for $Z_R$. The question now turns to what values of C1 and C2 will make MN/L 254 impedance-matched to $Z_R$. Given that adjustment of C2 provides a maximum power supply to the plasma, and given the fact that C2 controls only the imaginary part of the impedance match, it follows that in equation (3) below relating the load impedance $Z_R$ to the parameters of MN/L 254, the real part of load impedance $Z_R$ is unknown.

Thus, in step 305i, equation (3) is used to find the optimum values for C1 and C2 for power transfer to the plasma (for fixed L1 and L2 and the measured impedance $Z_R$) by forming a first equation between the real parts on the two sides of equation (3) and a second equation between the imaginary parts of that equation, thus forming two equations with two unknowns, which can be easily solved. This results in MN/L 254 being impedance matched to plasma load $Z_R$, resulting in optimal power flow to the plasma.

$$Z_R = \left(\left(j\omega L2 + \frac{1}{j\omega C2}\right)^{-1} + \left(\frac{1}{j\omega C1}\right)^{-1}\right)^{-1} + j\omega L1 + Z_0 \quad (3)$$

Referring again to FIG. 6A, in the next step 306, the power $P_S$ received by a particular electrode segment from the other electrode segments (e.g., adjacent electrode segments) is monitored. Since there are independent measures of the amount of power delivered to each electrode segment from its respective amplifier/power supply 230, the amount of power delivered to plasma 32, and the amount of power received by each electrode segment, the net power received by an electrode segment can be determined. It may be that the power $P_S$ received by an electrode segment from other electrode segments exceeds a certain predetermined threshold power value $P_T$ while power delivered to the plasma is equal (or sufficiently close) to the power supplied by the amplifier/power supply 230. This is determined in query step 307, which asks "$P_S > P_T$?" Where the answer to this query is "yes," the process proceeds to step 308, wherein phase shifter 224 is adjusted to alter the phase of amplifier/power supply 230 so as to reduce the value of $P_S$. This is done by iterating steps 307 and 308 until the answer to query step 307 is "no."

Once $P_S < P_T$, then the next step in the process is to proceed to the next electrode. Steps 303-308 are then iterated for the next electrode segment, as well as for the existing electrode segments, since changing the impedance $Z_{MN}$ of match network 254 changes the power delivered to plasma 32, which in turn changes the plasma load $Z_R$. In other words, since there is coupling between the electrode segments, dynamic monitoring and control of the power delivered to each electrode segment is required. An exemplary iteration time for the measurements, calculations and subsequent adjustments is about once per second.

Figure 6C:
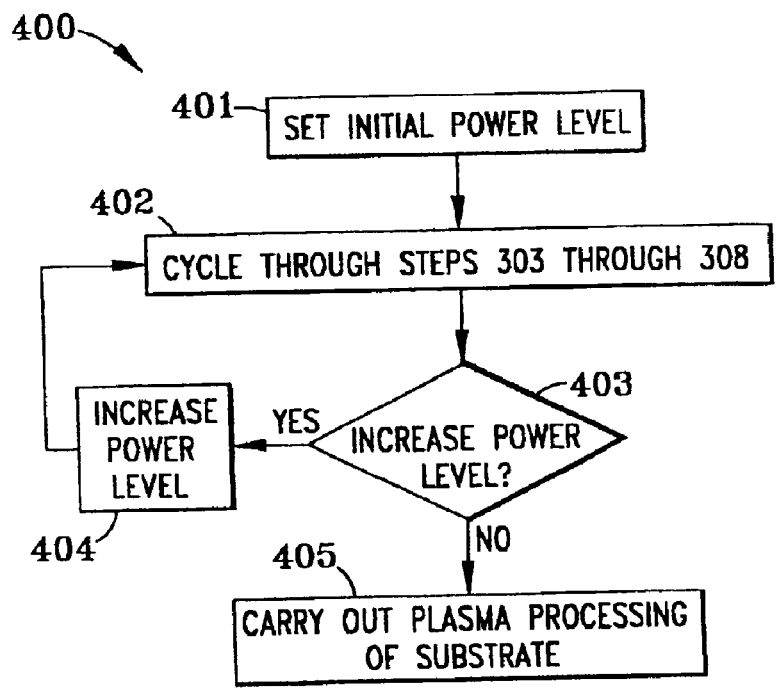
FIG. 6C is a flow diagram of a preferred method of practicing the present invention involving incrementally increasing the power to the electrode segments.

With reference now to FIG. 6C and flow chart 400, in step 401, it is preferable (though not necessary) that the method steps 303-308 of flow diagram 300 be carried out by progressively increasing the power level. For example, in step 401, the power level is set to an initial value that is substantially lower than the power level required for the particular plasma process. An exemplary power level might be 20% of full power, as mentioned above. The next step 402 is then cycling through steps 303-308 at this initial power level. The next step 403 asks if the power level is to be increased. If yes, then the process proceeds to step 404, in which the power level is increased. Next, step 403 is repeated at the higher power level. For example, the power level might be increased from an initial value of 20% full power to 60% full power to 80% full power and then to 100% full power. Once a satisfactory power level is achieved (which is typically 100% of the process power required), in step 405, the plasma processing of wafer 40 is carried out, while simultaneously controlling the power delivered to the electrode segments in the manner described above.

Alternate Phase Matching Network Embodiment

Figure 7:
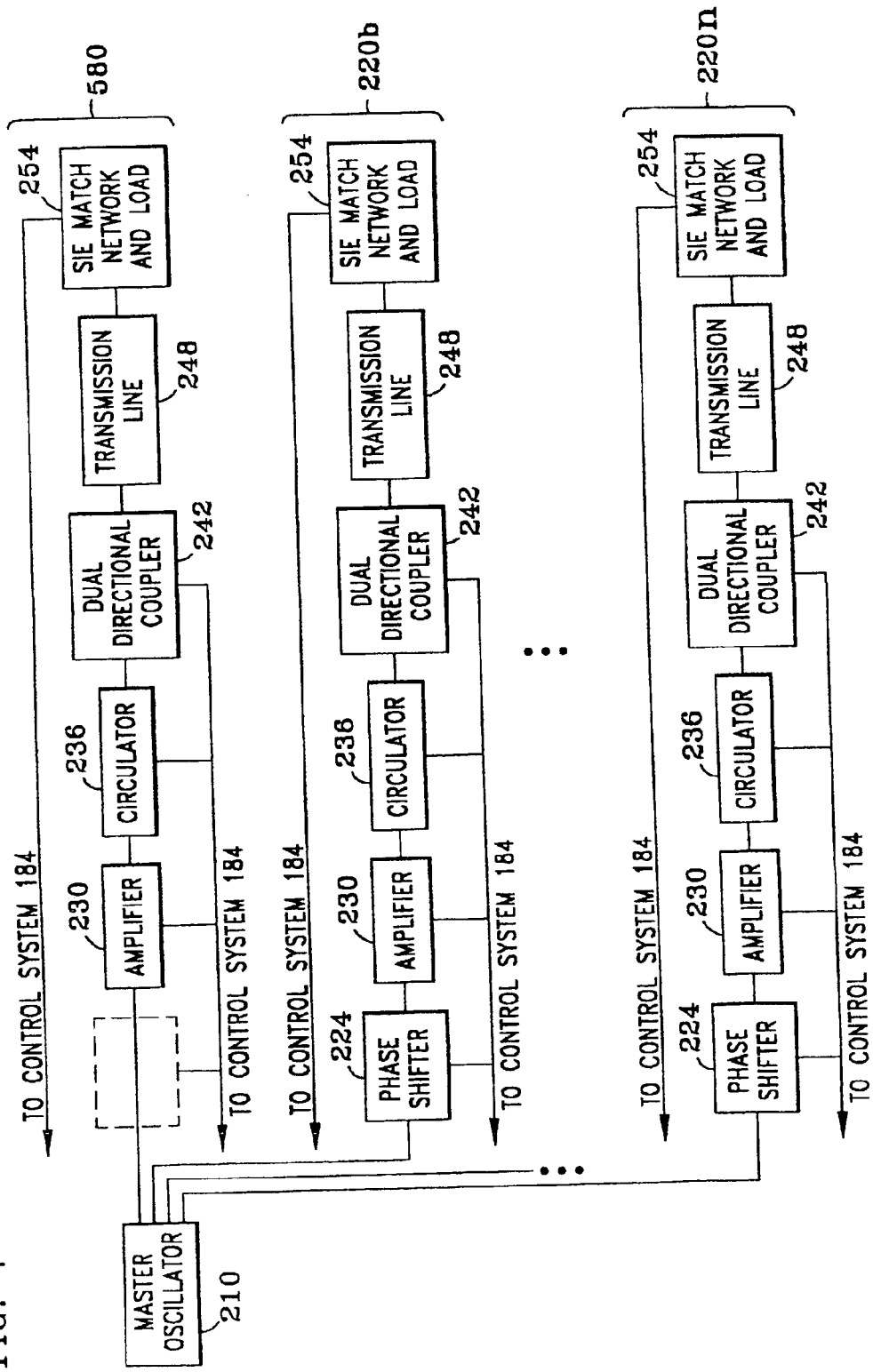
FIG. 7 is a schematic block diagram of an alternate embodiment of the RF power supply sub-system of the present invention, similar to that shown in FIG. 3, except that one phase shift network is removed.

With reference now to FIG. 7, an alternate embodiment of the present invention involves an RF power sub-system 580 identical to one of RF power sub-systems 220 as described above, except that phase shift network 224 is omitted. In the present embodiment, the phase of the power delivered to one electrode segment can be arbitrary, provided it does not change randomly. In other words, it must be stable, even if it is arbitrary. Then, by controlling the phase of the power being delivered to the other electrode segments via phase shifters 224, the lack of a priori knowledge about the phase of one electrode segment can be compensated by simply setting the phase relative to the electrode segment that does not have a set phase. Control of RF power sub-system 620 is otherwise the same as described above for RF power sub-systems 220a–220n.

Plasma Processing of Wafers

Figure 8:
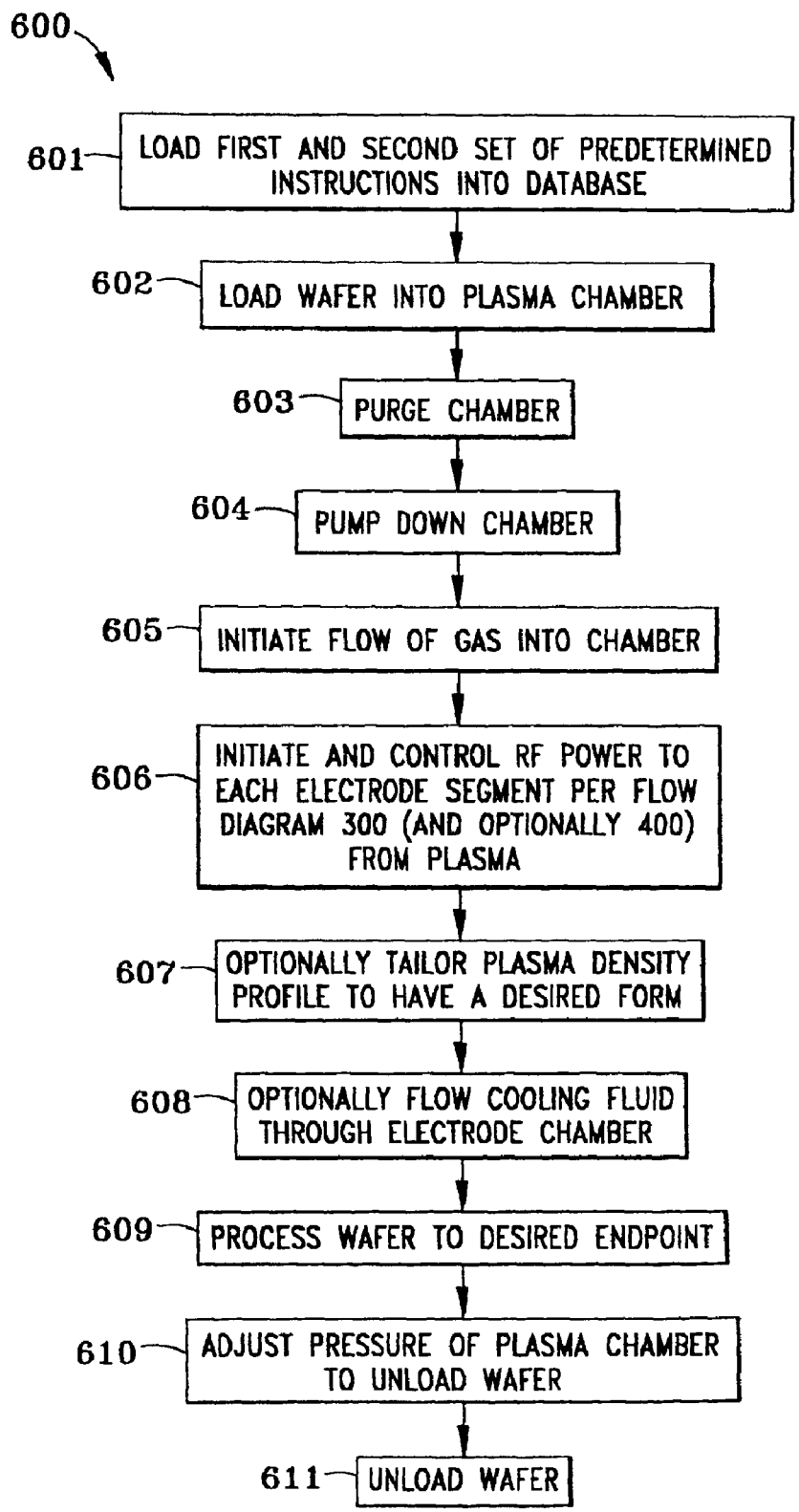
FIG. 8 is a flow diagram of the method of processing a wafer using the plasma reactor system of the present invention.

With reference again to FIG. 1 and also to FIG. 8 and flow diagram 600 therein, the steps for processing a wafer using the present invention are as follows. First, in step 601, a first predetermined set of instructions, such as a first computer program stored on computer-readable medium CRM and read into control system 184 from disk drive DD, or, alternatively, from database 190 electronically connected to or integral with control system 184 is loaded and stored in memory unit MU. This allows control system 184 to implement a user-defined recipe for plasma processing of wafer 40. In addition, a second predetermined set of instructions (e.g., a second computer program on a computer-readable medium CRM like the first), which includes the load impedance model discussed above, is similarly loaded into control system 184.

Next, in step 602, control system 184 sends a first electronic signal to wafer handling system 140 to initiate the loading and unloading of a wafer (substrate) 40 to and from substrate support member 34. Wafer 40 serves as a lower electrode with respect to electrode assembly 50. Next, in step 603, control system 184 then sends a second electronic signal to gas supply system 144 to initiate purging of plasma chamber 20 with a purge gas (e.g., nitrogen) from gas supply system 144. Next, in step 604, control system 184 generates a third electronic signal to vacuum system 176 to pump down plasma chamber 20 and to maintain a predetermined pressure in plasma chamber 20. Typical operating pressures in chamber 20 range from 1 to 100 mTorr, but may also significantly deviate from this range, depending on the plasma process.

In the next step 605, control system 184 sends a fourth electronic signal to gas supply system 144 to regulate the flow of gases from which a suitable plasma 32 may be formed, such as those gases mentioned above, from gas supply system to plasma chamber 20.

Next, in step 606, control system 184 sends electronic signals to respective RF power supply sub-systems 220a, 220b, . . . 220n to initiate and control the RF power to electrode segments 62a, 62b, . . . 62n of segmented electrode 60 and thus to plasma 32 in the manner described above. This allows for the maximum transfer of power through each electrode segment and to plasma 32 in the presence of energy being received by each electrode segment from other electrode segments. The spatial distribution of the RF electric field in plasma 32 depends on the capacitive coupling of the RF electric fields from segment electrodes 62a, 62b, . . . 62n to the plasma. The driving frequency of segment electrodes 62a, 62b, . . . 62n is, as mentioned above, preferably in the megahertz range. Also included in step 606 may be the steps of progressively increasing the power to the electrode segments, as described above in connection with flow diagram 6C and steps 401 through 404.

The desired density profile of plasma 32 may be uniform or non-uniform and designed to provide a particular plasma processing characteristic, for example an etch or a deposition characteristic. The desired plasma density profile may be predetermined as an idealization and formed based on the instructions stored in memory unit MU or database 190. Alternatively, the desired plasma density profile may be chosen from one of a number of stored plasma density profiles that can be created based on the available operating conditions and the instructions stored in memory unit MU or database 190. The plasma density profile may thus be tailored to a desired form by adjusting the RF power supplied to each electrode segment 62a, 62b, . . . 62n via RF power supply sub-systems 220a, 220b, . . . 220n, respectively. This is an optional step 607.

Where electrode assembly contains an electrode chamber through which a cooling liquid may be flowed, in the next step 608, control system 184 sends an electronic signal to cooling system 180 so that the flow of cooling fluid through the electrode chamber is adjusted to maintain electrode assembly 50 at a controlled temperature during operation when processing wafer 40.

In the next step 609, wafer 40 is processed with plasma 32 until a desired endpoint. During step 609, the power to the electrode segments 62a, 62b, . . . 62n and thus to plasma 32 is controlled in the manner described in detail above.

When processing of wafer 40 is complete, in step 610, control system 184 sends an electronic signal to vacuum system 176, which adjusts the pressure of chamber 20 to a setting where wafer unloading is done. Finally, in step 611, control system 184 sends an electronic signal to wafer handling system 140, which unloads wafer 40 from reactor chamber 20.

The present invention provides several advantages of the prior art. A first advantage is that it provides more precise control over etch uniformity in a plasma reactor by precisely controlling the amount of RF power delivered to electrode segments, and by differentiating between forward and reverse propagating power within each RF power supply sub-system. The present invention also provides for accurate measurements of current and voltage in each RF power supply sub-system so that the match network parameters can be set to minimize instantaneous voltage between electrode segments.

Another advantage of the present invention is that amplifiers/power supplies 230 do not have to have as large a power rating as those needed to drive a single large electrode. This is because the electrode segments are each smaller that a single large electrode. This means that match network 254 can be reduced in size, which reduces the overall cost of system 10. In particular, instead of having a single 5 kW power amplifier and a single large electrode, five 1 kW amplifiers can be used, and possibly even five 0.5 kW amplifiers, each connected to a respective one of 5 different electrode segments.

The many features and advantages of the present invention are apparent from the detailed specification and thus, it is intended by the appended claims to cover all such features and advantages of the described method which follow in the true spirit and scope of the invention. Further, since numerous modifications and changes will readily occur to those of ordinary skill in the art, it is not desired to limit the invention to the exact construction and operation illustrated and described. Moreover, the method and apparatus of the present invention, like related apparatus and methods used in the semiconductor arts that are complex in nature, are often best practiced by empirically determining the appropriate values of the operating parameters, or by conducting computer simulations to arrive at best design for a given application. Accordingly, all suitable modifications and equivalents should be considered as falling within the spirit and scope of the invention.

What is claimed is:

1. A method of controlling RF power delivered to a plurality of electrode segments in the processing of a substrate with a plasma having a plasma load impedance, each electrode segment being connected to a match network having a capacitance and a match network impedance, the method comprising:
   a) providing RF power having a phase to a first of said electrode segments;
   b) measuring the power delivered to the plasma and the power reflected from the plasma;
   c) adjusting said match network capacitance based on the measured delivered power and the measured reflected power to achieve maximum transfer of RF power to the plasma through said first electrode segment;
   d) measuring the power received by said first electrode segment from one or more of said electrode segments; and
   e) adjusting said phase of said RF power based on the measured received power so as to reduce said power received by said first electrode segment from said one or more electrode segments.

2. A method according to claim 1, wherein said adjusting of said match network capacitance includes adjusting the capacitance of at least one of first and second capacitors in said match network.

3. A method according to claim 2, wherein said adjusting of said match network capacitance further includes:
   i) adjusting the capacitance of said first capacitor so the that a power reflection coefficient between the matched network and the plasma has a first minimum value.

4. A method according to claim 3, wherein, after said adjusting the capacitance of said first capacitor, said adjusting of said match network capacitance further includes:
   ii) adjusting the capacitance of said second capacitor so the power reflection coefficient is at a second minimum value less than said first minimum value;
   iii) calculating a value for the plasma load impedance based on said second minimum value of the power reflection coefficient and an impedance value for said RF power provided in said step a); and
   iv) computing new capacitances for said first and second capacitors, based on said calculated value of the plasma load impedance, that results in matching the match network impedance with the plasma load impedance.

5. A method according to claim 4, wherein, after said calculating a value for the plasma load impedance, adjusting said first and second capacitors to said new capacitances.

6. A method of processing a substrate in a plasma chamber capable of supporting a plasma in an interior region thereof, and having an electrode comprising a plurality of electrode segments, the method comprising:
   a) loading a wafer into the plasma chamber interior;
   b) initialing a flow of gas into the plasma chamber interior;
   c) providing and controlling an amount of RF power delivered to the electrode segments according to the method of claim 5; and
   d) exposing the substrate to the plasma until the substrate is processed to a desired endpoint.

7. A method according to claim 6, wherein said method is carried out via a computer based on said method being stored as a set of instructions in said computer.

8. A computer-readable medium which stores the method of claim 6 as a set of instructions for a computer.

9. A method according to claim 1, further including iterating steps a) through e) for each electrode segment one or more times.

10. A method according to claim 9, wherein each iteration is performed in one second or less.

11. A method according to claim 9, further including increasing the amount of RF power provided in said provided to said first electrode segment for one or more of the iterations.

12. A method according to claim 11, further including increasing the RF power until it reaches a maximum power level, and then plasma processing a substrate at said maximum power level.

13. A method of processing a substrate in a plasma chamber capable of supporting a plasma in an interior region thereof, and having an electrode comprising a plurality of electrode segments, the method comprising:
   a) loading a wafer into the plasma chamber interior;
   b) initialing a flow of gas into the plasma chamber interior;
   c) providing and controlling an amount of RF power delivered to the electrode segments according to the method of claim 10; and
   d) exposing the substrate to the plasma until the substrate is processed to a desired endpoint.

14. A method according to claim 13, wherein said method is carried out via a computer based on said method being stored as a set of instructions in said computer.

15. A computer-readable medium which stores the method of claim 13 as a set of instructions for a computer.

16. A method according to claim 1, wherein said method is carried out via a computer based on said method being stored as a set of instructions in said computer.

17. A computer-readable medium which stores the method of claim 1 as a set of instructions for a computer.

* * * * *